United States Patent
Wu

(10) Patent No.: US 7,304,863 B1
(45) Date of Patent: Dec. 4, 2007

(54) INTEGRATED CIRCUIT INCLUDING EXTERNAL ELECTRONIC COMPONENTS WITH LOW INSERTION LOSS

(75) Inventor: Weijia Wu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 496 days.

(21) Appl. No.: 10/457,630

(22) Filed: Jun. 9, 2003

(51) Int. Cl.
  H05K 7/02 (2006.01)
  H05K 7/06 (2006.01)
  H05K 7/08 (2006.01)
  H05K 7/10 (2006.01)

(52) U.S. Cl. ............ 361/780; 361/784; 361/792

(58) Field of Classification Search ........... 361/780, 361/782, 783, 734, 738, 794; 257/700, 724, 257/691
See application file for complete search history.

(56) References Cited

U.S. PATENT DOCUMENTS 6,437,599 B1* 8/2002 Groen .................. 326/63
6,700,076 B2* 3/2004 Sun et al. .............. 174/262
6,722,031 B2* 4/2004 Japp et al. ............. 29/852

OTHER PUBLICATIONS

Maxim Integrated Products, "Introduction to LVDS, PECL, and CML," Sep. 2000, pp. 1-14.
PMC-Sierra, "Designing Multi-Gigabit Serial Backplanes with High Speed SERDES Solutions," Sep. 2000, pp. 1-16.
Kal Mustafa and Chris Sterzik, Texas Instruments,"AC-Coupling Between Differential LVPECL, LVDS, HSTL, and CML," Mar. 2003, pp. 1-20.

* cited by examiner

Primary Examiner—Tuan T. Dinh

(57) ABSTRACT

An integrated circuit package can include electronic components used to enhance the performance of the integrated circuit that is part of the package. In order to reduce some adverse effects of including the electronic components, void regions are introduced into portions of the integrated circuit package interconnect layers.

19 Claims, 4 Drawing Sheets

INTEGRATED CIRCUIT INCLUDING EXTERNAL ELECTRONIC COMPONENTS WITH LOW INSERTION LOSS

TECHNICAL FIELD

The present invention relates to integrated circuits, and particularly to integrated circuits having external electronic components coupled to the integrated circuit package.

BACKGROUND

In a communications network, switching, routing, and transponder devices (generally referred to in this application as "switches") receive data at one of a set of input interfaces and forward the data on to one or more of a set of output interfaces. Users typically require that such switching devices operate as quickly as possible in order to maintain a high data rate. Switches are typically data link layer devices that enable multiple physical network (e.g., local area network (LAN) or wide area network (WAN)) segments to be interconnected into a single larger network. Switches forward and flood data traffic based on, for example, MAC addresses.

Because they are typically designed to accommodate high speed traffic and support high capacity data transmission, many new switches employ multi-gigabit backplane designs involving high speeds and fast edge rates. Although early backplane-based systems used wide parallel buses and fast signal clock rates, as requirements reached the one Gbit per second range it became difficult to reliably transmit data over such buses because of a variety of problems including signal skew, crosstalk, and load problems. Consequently, backplane design has shifted from parallel buses to serial interconnects. Using integrated circuit serializer-deserializer (SERDES) solutions, backplanes can transmit a serial stream that combines data and clock in the same signal.

Nevertheless, the signal integrity of these high-speed serial links is affected by a host of conditions including reflections due to impedance mismatches along the signal path, signal attenuation from backplane materials, added noise due to crosstalk and Inter Symbol Interference (ISI). Moreover, the interface between these high-speed integrated circuits becomes more important in achieving high performance, low power, and good noise immunity. Three commonly used interfaces for such high speed circuits are positive-referenced emitter-coupled logic (PECL), low-voltage differential signals (LVDS), and current mode logic (CML). When designing high-speed systems, the problem of how to connect different integrated circuits using such interfaces is often encountered.

FIG. 1 illustrates a simplified schematic diagram of a current mode logic output driver circuit coupled to a load. Current mode logic output driver 110 is in general part of an integrated circuit 100 that might be, for example, a physical layer (PHY) transceiver chip including serializer/deserializer functionality. In this example, CML output driver 110 transmits a serialized data stream through differential output nodes 120 and 130, over transmission lines (typically printed circuit board (PCB) traces), and to a load device 150 (typically an input interface for another integrated circuit). CML output driver 110 is shown AC-coupled to load device 150 using coupling capacitors C1 and C2. Although output drivers like CML output driver 110 do not necessarily need to be AC-coupled to the load they are driving, AC-coupling is often used to change the common-mode voltage level when interconnecting different physical layers. Capacitors C1 and C2 remove the DC component of the signal (common-mode voltage), while the AC component (voltage swing) is passed on to the load. For each output node 120 and 130, series resistors and inductors (R1 & L1, and R2 & L2) are added in a path back to the supply voltage $V_{DD}$ to enhance the performance of the AC-coupled driver and to provide a current path for the DC component.

CML output driver performance thus depends in part on the careful selection of component values for inductors L1 & L2 and resistors R1 & R2. Although this component selection can be left to the manufacturer of the printed circuit board that will included integrated circuit 100, load device 150, and electronic components L1, L2, R1, R2, C1, and C2, the designer and/or manufacturer of integrated circuit 100 may prefer to specify some or all of those components so that adequate performance is achieved. Moreover, it may be preferable, e.g., for quality control or testing, for the designer and/or manufacturer of integrated circuit 100 to select the actual components to be used. Additionally, certain performance advantages are obtained by adding the components as close to the integrated circuit as possible. Although in some cases, resistors and inductors can be included in the integrated circuit itself, this often requires large amounts of integrated circuit die space (thus increasing the overall cost of the integrated circuit) and may pose certain problems related to the design of the integrated circuit or the manufacturing process used to fabricate the integrated circuit.

Accordingly, it is desirable to have an electronic component solution that provides the desired level of performance through the use of electronic components external to the integrated circuit while still providing the designer and/or manufacturer adequate control of component selection and placement and preserving adequate levels of circuit performance.

SUMMARY

It has been discovered that an integrated circuit package can include electronic components used to enhance the performance of the integrated circuit that is part of the package. In order to reduce some adverse effects of including the electronic components, void regions are introduced into portions of the integrated circuit package interconnect layers.

Accordingly, one aspect of the present invention provides an apparatus including an integrated circuit package substrate and an integrated circuit coupled to the integrated circuit package substrate. The integrated circuit package substrate includes a first electrically conductive layer and a second electrically conductive layer. The first electrically conductive layer includes a plurality of contacts configured to receive at least one electronic component. The second electrically conductive layer is located below the first electrically conductive layer and includes at least one void region located below at least one of the plurality of contacts.

Another aspect of the present invention provides a method. An integrated circuit package substrate is provided. A first metal layer is formed on the integrated circuit package substrate. The first metal layer includes at least one void region where no metal is located. A second metal layer is formed above the first metal layer. The second metal layer includes a plurality of contacts configured to receive at least one electronic component. At least one of the plurality of contacts is located directly above the at least one void region. An integrated circuit is mounted on the integrated circuit package substrate.

Still another aspect of the present invention provides an integrated circuit package including a first means for interconnecting circuit nodes including a plurality of means for making electrical contact with an electronic component; a second means for interconnecting circuit nodes, wherein the second means for interconnecting circuit nodes is positioned beneath the first means for interconnecting circuit nodes, the second means for interconnecting circuit nodes including at least one means for reducing capacitance associated with a conductive path; and a means for interfacing to a high-speed circuit coupled to the first means for interconnecting circuit nodes.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

Figure 2:
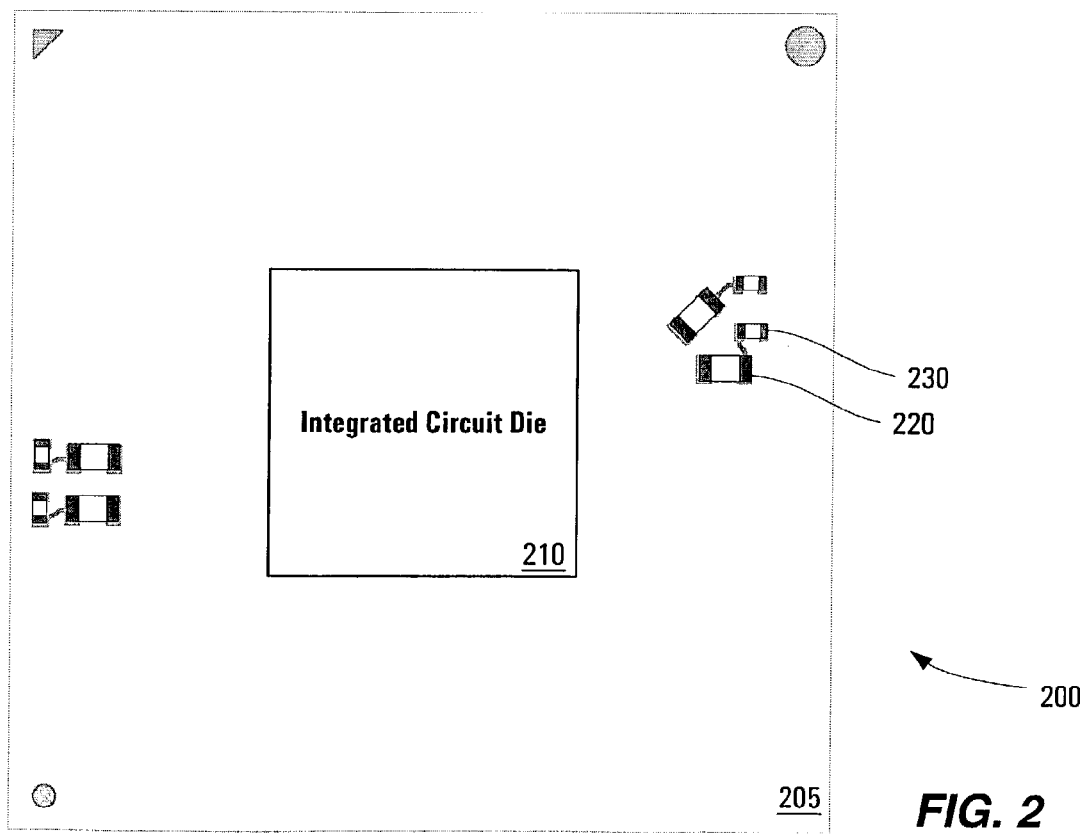
FIG. 2 illustrates a simplified diagram of an integrated circuit package including surface mount resistors and inductors.

FIG. 2 illustrates a simplified diagram of an integrated circuit package including surface mount resistors and inductors. Integrated circuit package 200 includes a top package surface 205 upon which integrated circuit die 210 is mounted. Integrated circuit package 200 can utilize any of a variety of different packaging technologies, but is typically implemented using some type of area array packaging technology such as one of the many ball grid array (BGA) implementations. In general, rigid (as opposed to flexible) BGA package construction typically uses organic substrates manufactured from BT-resin (bismaleimide-triazine) or materials typically used for printed circuit boards such as FR-4. The integrated circuit die is electrically coupled to the package interconnect using wire or flip chip attachment. This substrate incorporates metallized trace routing for connection of the die to the system board through solder balls, instead of metal leads used in leaded packages or pins used in pin grid array packages.

In part because of the inductance effects associated with the wires used in wire bond technologies, flip chip connection is particularly desirable for high-speed integrated circuits. Flip chip is not a specific package or even a package type (like BGA), rather it describes the method of electrically connecting the die to the package carrier. The package carrier, either substrate or lead frame, then provides the connection from the die to the exterior of the package. In standard wire bonded packaging, the interconnection between the die and the carrier is made using wire. The die is attached to the carrier face up, then a wire is bonded first to the die, then looped and bonded to the carrier. Wires can be several mm in length, and 25-35 μm in diameter. In contrast, the interconnection between the die and carrier in flip chip packaging is made through a conductive bump that is placed directly on the die surface. The bumped die is then flipped over and placed face down, with the bumps connecting to the carrier directly. A bump is typically 70-100 μm high, and 100-125 μm in diameter. The flip chip connection is generally formed one of two ways: using solder or using conductive adhesive. The solder bumped die is attached to a substrate by a solder reflow process, very similar to the process used to attach BGA balls to the package exterior. After the die is soldered, underfill is added between the die and the substrate. Underfill is a specially engineered epoxy that fills the area between the die and the carrier, surrounding the solder bumps. It is designed to control the stress in the solder joints caused by the difference in thermal expansion between the silicon die and the carrier. Once cured, the underfill absorbs the stress, reducing the strain on the solder bumps, greatly increasing the life of the finished package. The chip attach and underfill steps are the basics of flip chip interconnect. Beyond this, the remainder of package construction surrounding the die can take many forms and can generally utilize existing manufacturing processes and package formats.

The substrates used for BGA packages can also provide connections, contacts, or pads for mounting surface mount components such as inductors 220 and resistors 230. Inductors 220 are typically some type of surface mount chip inductor based on laser spiral, multilayer ceramic, thick film ceramic, photolithic, or wirewound construction. For example, inductors 220 can be 100 nH high Q (quality factor or measurement of the loss of the inductor), high SRF (self-resonant frequency). In another example, inductors 220 are chosen from the LLV 1005-FB series multilayer chip inductors available from Toko America. Other surface mount inductor technologies can also be used. Similarly, surface mount resistors 230 can include a variety of different types of surface mount resistors including bulk metal foil, metal electrode leadless face (MELF), metal strip, thick film, thin film, and wirewound. In one example, surface mount resistors 230 are 49.7 ohm ERJ 1GE thick film chip resistors available from Panasonic (Matsushita Electric Corporation of America). In general, any surface mount electrical component can be used. Thus, other devices such as capacitors or active components can be mounted to integrated circuit package 200.

Figure 3:
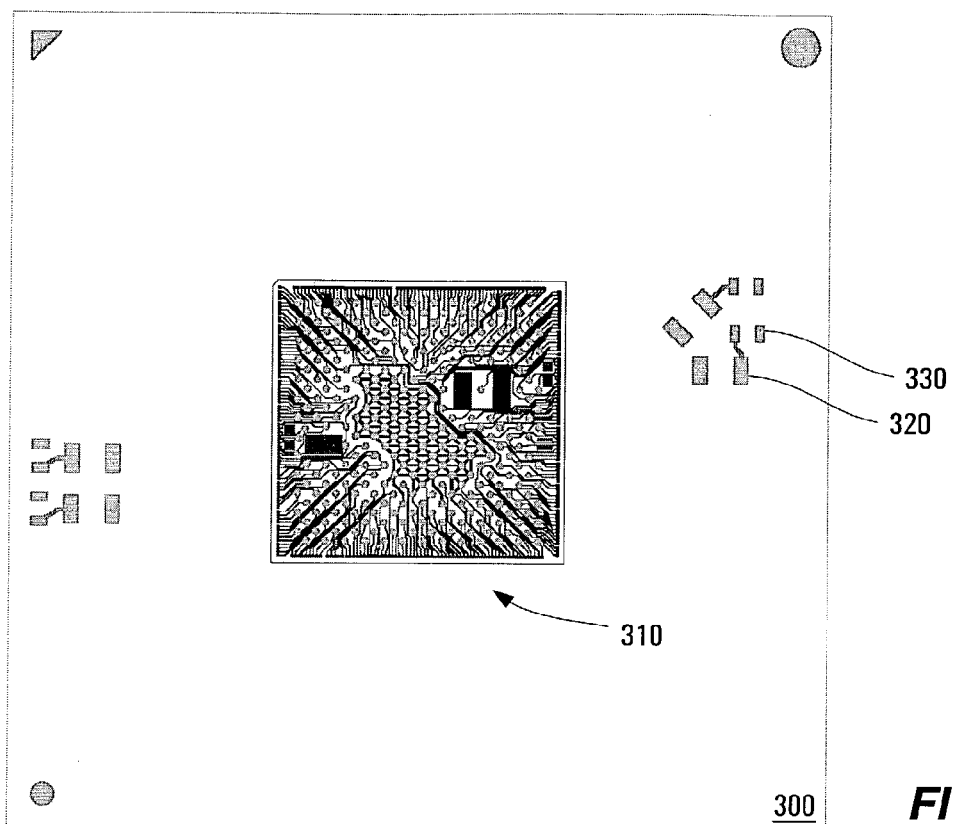
FIG. 3 illustrates a simplified diagram of die level circuit interconnect for an integrated circuit package.

FIG. 3 illustrates a simplified diagram of die level circuit interconnect for an integrated circuit package. Top interconnect layer 300 includes a variety of pads, contacts or interconnects 320 and 330 to accommodate surface mount components such as surface mount inductors 220 and resistors 230. A more complex interconnect region 310 is also shown. Various pads can also have interconnecting conductive traces to provide component connection as may be desired. Interconnect region 310 illustrates the many connections (e.g., pads for flip chip connection along the perimeter) for use to connect an integrated circuit die to the integrated circuit package 300. In general, the pads and interconnects are formed using a conducting layer, typically a low resistance metal such as copper, sized and shaped to provide appropriate patterns. Layers such as layer 300, and indeed many layers of the integrated circuit package substrate such as insulating dielectric layers, are fabricated using integrated circuit package techniques and printed circuit board fabrication techniques that are well known to those having ordinary skill in the art.

Figure 4:
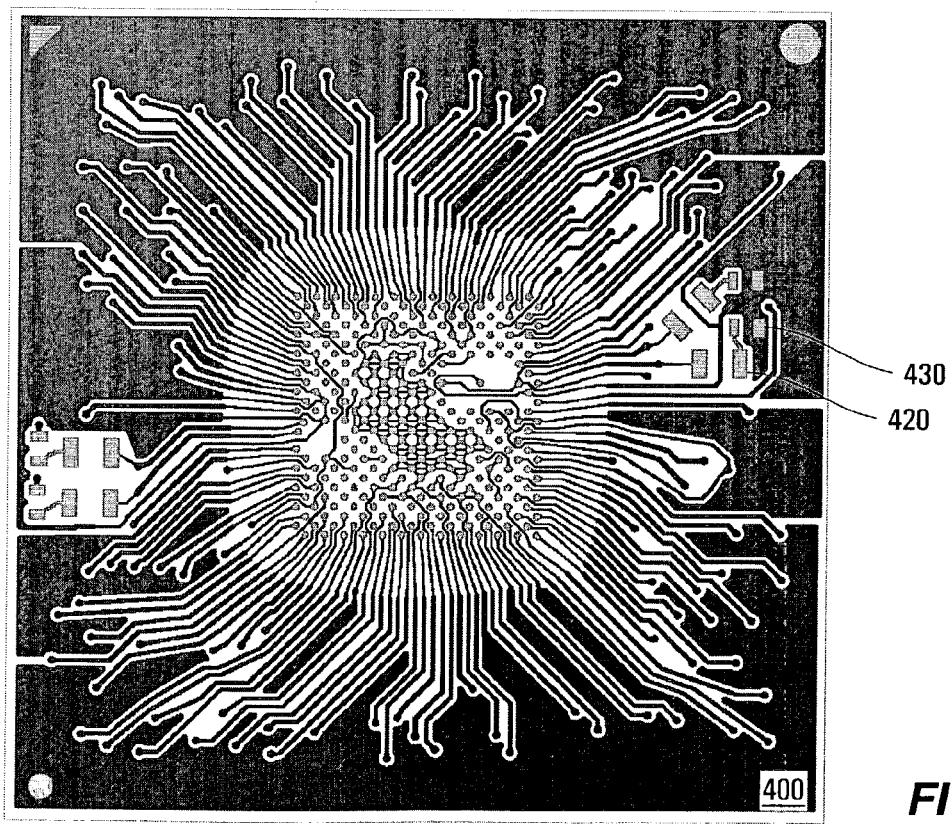
FIG. 4 illustrates a simplified diagram of another level of circuit interconnect for an integrated circuit package.

FIG. 4 illustrates a simplified diagram of another level of circuit interconnect for an integrated circuit package. Conducting interconnect layer 400 includes a variety of features, contacts, traces, etc., for routing signals and interconnecting various portions of an integrated circuit to each other and/or to output terminals in the package, e.g., solder balls in a BGA package. In particular, interconnect layer 400 provides interconnection with layer 300 of FIG. 3 through circuit vias, through holes, and other layer-to-layer interconnect schemes (not shown). Thus, layer 400 is generally situated below layer 300 in an integrated circuit package. Additionally, certain portions of each layer can have corresponding and somewhat similar features. For example, interconnect portions 420 and 430 generally correspond to contacts 320 and 330. However, some traditional interconnect layer features can degrade circuit performance, particularly during high-speed, i.e., high frequency, operation. For example, interconnect structures like 420 and 430 can lead to capacitive effects between layers thereby resulting in signal degradation, e.g., insertion loss, along the transmission path and jitter (waveform triggering uncertainty) in the high-speed signal.

Figure 5:
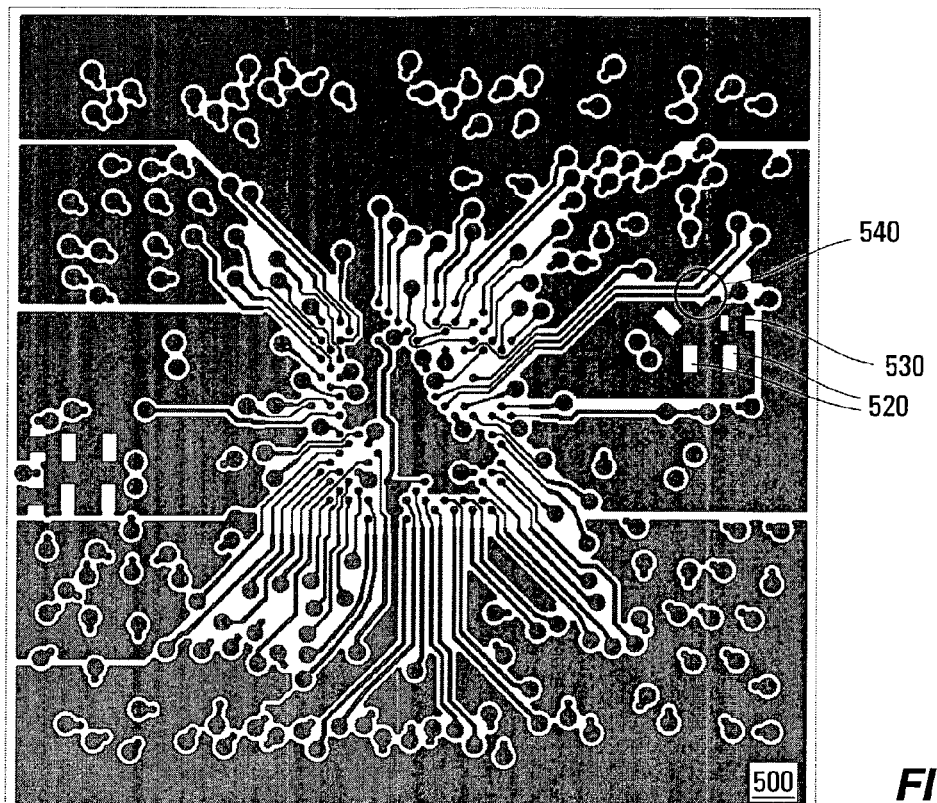
FIG. 5 illustrates a simplified diagram of still another level of circuit interconnect for an integrated circuit package.

FIG. 5 shows void regions or structures included as part of an electrically conductive layer to help reduce the parasitic effects. While electrically conductive layer 500 again includes a number of features facilitating electrical interconnect among layers of an integrated circuit, it also includes void regions 520 and 530. For example, void regions 520 are sized to correspond to the connectors in a previous layer such as contacts 420 in layer 400. Similarly, void region 530 is designed to correspond to contacts 430. Void regions 520 and 530 are areas in the conducting layer where no conducting material is deposited or conducting material that was deposited has been removed. The absence of the conducting material helps to reduce the capacitive effects that would otherwise exist. While it is generally preferable that void regions be sized to match corresponding features in other layers, this need not be the case. Moreover, void regions are typically designed so that there is at least partial if not complete alignment with the corresponding interconnect feature. So, for example, void regions 520 can be designed so that they are located directly below corresponding interconnect features in layer 400 of FIG. 4. In other examples, there is only partial alignment, or the size or shapes of the void region and its corresponding interconnect feature are such that there is only partial overlap. Void regions can have differing areas and shapes, and may approximate the size, shape, or area of a corresponding interconnect feature in another layer. Alternately, a void region can have a size, shape, or area that does not resemble a feature to which the void region is designed to correspond. Additionally, not all interconnect regions need have a corresponding void region. For example, the area shown at 540 generally corresponds to one of the contacts 420 of layer 400. However, because of other interconnect design features or constraints, conductive traces pass through area 540 which might otherwise contain a void region.

Figure 6:
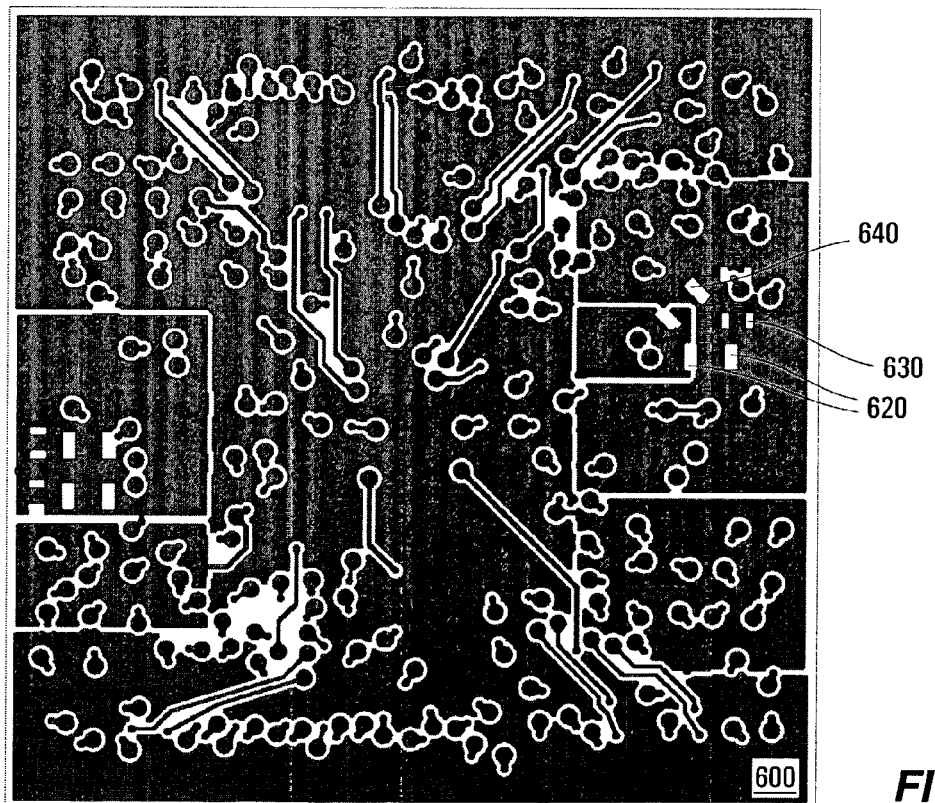
FIG. 6 illustrates a simplified diagram of yet another level of circuit interconnect for an integrated circuit package.

In general, multiple layers containing void regions can be utilized to further reduce effects associated with coupling surface mount components to an integrated circuit package. Thus, FIG. 6 illustrates a simplified diagram of yet another level of circuit interconnect for an integrated circuit package. Conducting interconnect layer 600 includes a variety of interconnect features as well as various void regions 620, 630, and 640 are generally sized to match corresponding features in other layers, however this need not be the case. Additionally, some void regions may correspond to interconnect features appearing in conducting layers several conducting layers above the layer including the void region in question. For example, conducting interconnect layer 500 of FIG. 5 may be positioned between conducting interconnect layers 400 and 600. In that case, void regions 620, 630, and 640 are generally designed to correspond to interconnect features in conducting interconnect layer 400, i.e., contacts 420 and 430. Additionally, void regions corresponding to a particular interconnect feature can occur on one or more conducting interconnect layers. Two or more void regions corresponding to the same interconnect feature can have the same, similar, or completely different areas, sizes, and or shapes. A single void region can be designed to correspond to one or more interconnect features.

Figure 7:
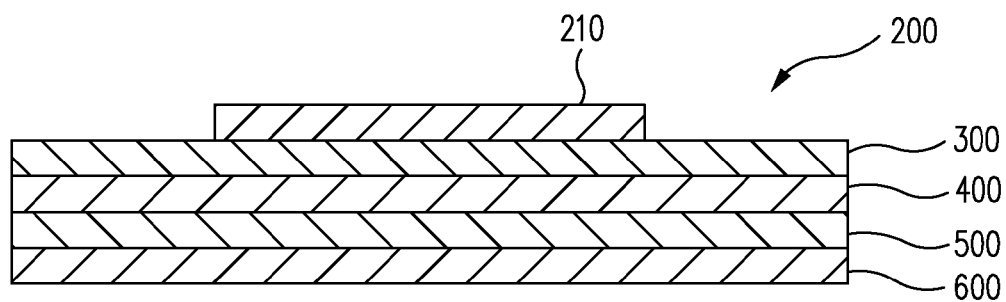
FIG. 7 is a side view of the integrated circuit package of FIG. 2, showing the integrated circuit die and supporting interconnect layers of FIGS. 3 through 6.

FIG. 7 is a side view of the integrated circuit package 200 of FIG. 2, showing the structural relationship of integrated circuit die 210, interconnect layer 300 (FIG. 3), interconnect layer 400 (FIG. 4), interconnect layer 500 (FIG. 5) and interconnect layer 600 (FIG. 6).

Throughout this application, reference will be made to printed circuit boards and PCB fabrication technology. However, those having ordinary skill in the art will understand that PCBs and PCB technology generally includes related terms and technology including printed wiring boards and electronic circuit boards.

A printed circuit board typically includes one or more dielectric layers that electrically insulate conductive traces formed on a surface of a dielectric layer and/or between dielectric layers. Multiple dielectric layers and traces can be combined as desired. The dielectric materials used to construct PCBs typically include a fiber glass reinforcement combined with a resin. Fiber glass reinforcements can be woven, i.e., numerous glass fibers woven together to form a glass cloth, or un-woven. The fiber glass is combined with resin to produce a rigid board. For example, epoxy resin is a polymer which can combine with a complementary molecule (the hardener) to form a semi solid material. The resin is an organic molecule with active sites at which it can bind to the hardener. If the epoxy molecule is a chain, with a site on each end it is referred to as "difunctional." The hardener is similar but has the complementary binding sites and geometry to form a rigid material when the two parts are mixed and cured. Thus, the fiber glass generally provides strength to the board, while the resin provides rigidity. Well known examples of such PCB materials include FR-4, BT epoxy glass, and polyimide glass. Other materials including materials that are reinforced with non-glass materials are also well known in the art. The materials used to form conductive traces in PCBs can include a variety of different electrical conductors such as copper alloys and copper foil.

As noted above, a variety of different PCB technologies can be used. For example, flexible printed wiring technology can be used to implement the described high-density connectors. Flexible printed circuits have many similarities to rigid boards, but the substrate or dielectric material is different from the glass-fiber-epoxy composite material typically used in rigid boards. Typical flexible circuit substrate materials include polyester, polyimide, fluorocarbons, aramid (nylon) paper, and combinations (composites) of these.

The discussion above has emphasized the use of area array integrated circuit packages, e.g., ball grid array packages, built on flexible film or rigid printed circuit board (PCB) material substrates. Moreover, flip-chip die attachment techniques have been emphasized because they are often used for high-speed integrated circuits. However, the techniques and devices disclosed in this application can, in general, be used in conjunction with a variety of different integrated circuit packaging types and techniques for electrically connecting the die to the package carrier. For example, techniques and devices disclosed in this application can be applied to a variety of different integrated circuit packaging technologies including: pin grid array (PGA) packages, ball grid array (BGA) packages, dual in-line packages, quadrant (quad) packages, chip-scale packages, chip-on-board (COB) packages, multi-chip modules, flip-chip bonding, and wire bonding. Still other packaging and die bonding techniques compatible with the teachings of the present application will be known to those having skill in the art.

Returning briefly to FIGS. 1 and 2, it is noted that the techniques and devices of the present application can be utilized in conjunction with a variety of different type of integrated circuits and integrated circuit packages. However, in one embodiment, integrated circuit die 210 includes a physical layer (PHY) transceiver circuitry including serializer/deserializer functionality. Moreover, integrated circuit die 210 utilizes a CML output driver such as the driver 100 configured in an AC-coupled manner. For example, the integrated circuit can be an XPIO8820 physical layer transceiver from Lattice Semiconductor Corporation.

In such an example, the transceiver includes a variety of functional blocks including a low power, low jitter, and fully integrated serializer/deserializer chip. It operates in the data rate range of 9.9-10.7 Gbps, performs all necessary parallel-to-serial and serial-to-parallel conversions, and meets SONET/SDH jitter specifications. The transceiver is suitable for the applications of OC-192/STM-64, 10GE, 10GFC, and OC-192/STM-64 with 15/14 forward error correction (FEC) coding and G.709 FEC. The serial interface I/O uses the aforementioned CML standard while the low speed parallel I/O is based on the aforementioned LVDS standard. These standards are compliant to both the Optical Interface Forum's SFI-4 standard and the 10GbE's XSBI interface standard. The LVDS parallel I/O also supports the features in Multi-Standard-Agreement (MSA) 300 and 200.

The transmitter portion of the transceiver performs the serialization process to convert the 16-bit parallel LVDS data stream to bit serial format at approximately 10 Gbps data rate. The transmitter includes an LVDS data receiver, a FIFO, a 16:1 serializer, a low jitter CMU, and 10 Gbps output data driver. The LVDS data receiver uses 16 pairs of differential LVDS data input. This data is aligned to an LVDS input clock. LVDS input receivers convert LVDS signals to CMOS signals, and latch to signals based on an internal clock that is generated from the input clock through a phase-lock-loop (LVPLL) . In order to achieve the optimized latch timing, the phase relationship between the internal clock and the LV clock can be adjusted by programming. The transmitter elastic buffer is a 16 bit wide and 8-word deep FIFO designed to decouple the LVDS clock and transfer data to a cleaner transmission-clock domain. Additionally, the FIFO is also placed to tolerate minor phase difference between the FIFO write clock and read write clock due to clock inaccuracy, phase drift or phase wander. The FIFO circuitry can indicate an overflow or underflow condition by outputting an appropriate signal.

Figure 1:
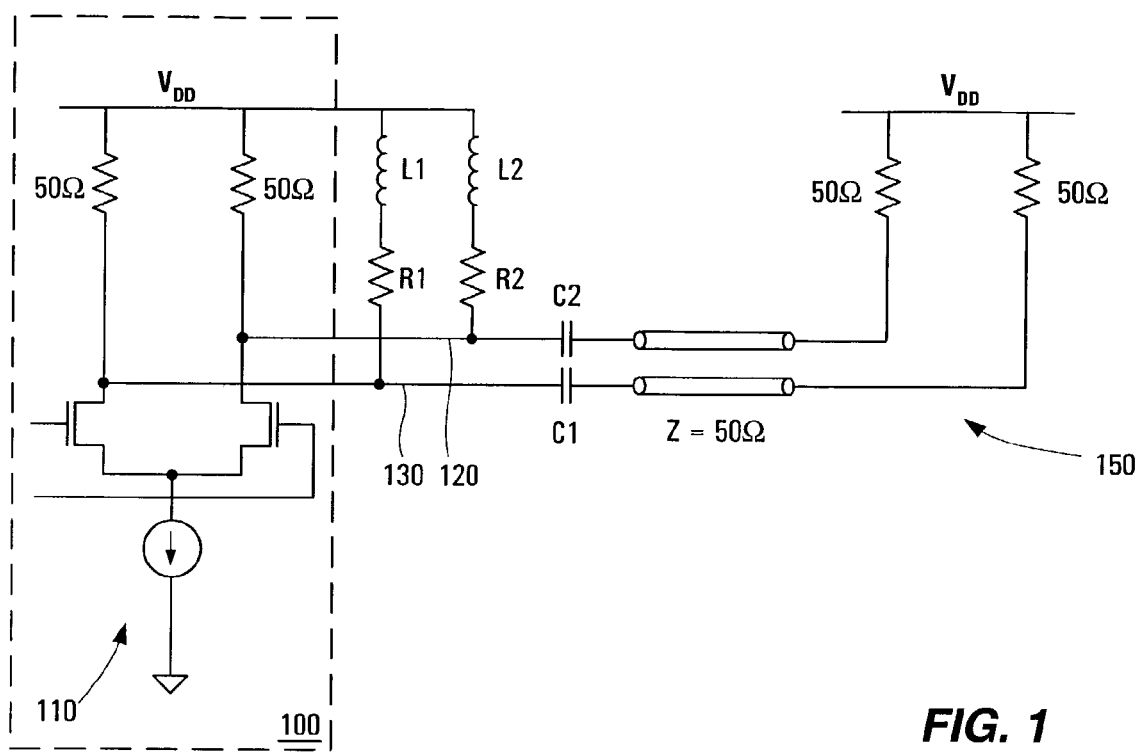
FIG. 1 illustrates a simplified schematic diagram of a current mode logic (CML) output driver circuit coupled to a load.

The output data bus from the FIFO feeds a 16:1 serializer to generate a 9.953 Gbps (OC-192 rate) data stream. The high-speed clock is an OC-192 compliant low jitter clock generated by a clock multiplication unit (CMU). The serial data stream in turn becomes an input to a differential high-speed CML data driver, such as that illustrated in FIG. 1. This CML driver has incorporated an internal 50-ohm termination resistor on both P and N branches for impedance matching of PCB transmission lines. The CML output can also be AC-coupled as shown in FIG. 1. The output current of the CML driver can be adjusted through programming to achieve the trade-offs between power consumption and performance. The CMU includes a fully differential PLL that is capable of producing low jitter, and a SONET/SDH specification compliant serial clock.

The transceiver integrates a highly sensitive limiting amplifier, which allows the transceiver to directly connect to the output of a trans-impedance amplifier (TIA). An amplifier offset compensation technology is developed and implemented along with the limiting amplifier to achieve superior amplifier input sensitivity.

One component of the transceiver's receiver section is a clock and data recovery (CDR) block. The CDR block extracts the clock from an incoming high-speed non-return to zero (NRZ) data, and retimes the data based on the recovery clock. The clock extraction is performed through the comparison of the phase relationship between transitions of the data, and the internal clock. The purposes of the reference clock are two fold: one is training a VCO to the target frequency, and another is generating a stable clock signal when the input serial data is absent. Also implemented is CDR lock detector circuitry that monitors the frequency of the internal clock. As the frequency of the internal clock is within a certain range of the target frequency, a lock flat is set.

The transceiver uses a 1:16 demultiplex to deserialize the high speed output data from CDR, and to generate a 16 bit parallel data stream. The bit order swapping in the receiver corresponds to its similar function in the transmitter. The 16-bit parallel data and clock signal are sent out via the LVDS data transmitter. The relationship between data and clock is source-synchronous.

Although the present invention has been described with respect to a specific preferred embodiment thereof, various changes and modifications may be suggested to one skilled in the art and it is intended that the present invention encompass such changes and modifications that fall within the scope of the appended claims.

What is claimed is:

1. An apparatus comprising:
    an integrated circuit package substrate including a first electrically conductive layer and a second electrically conductive layer, wherein the first electrically conductive layer includes a plurality of contacts configured to receive at least one surface mount electronic component, and wherein the second electrically conductive layer is located below the first electrically conductive layer and includes at least a first void region located below a first contact of the first electrically conductive layer and a second void region below a second contact of the first electrically conductive;

an integrated circuit die coupled to the integrated circuit package substrate; and an electronic component surface mounted to the first contact and the second contact of the first conductive layer; wherein:

the plurality of contacts of the first electrically conductive layer includes a third contact and a fourth contact, the second contact being electrically coupled to the third contact;

the integrated circuit die further comprises a driver circuit having an output node electrically coupled to the first contact; and the integrated circuit die further comprises a power supply node electrically coupled to the fourth contact;

the apparatus further comprising:

an inductor coupled between the first contact and the second contact, and a resistor coupled between the third contact and the fourth contact.

2. The apparatus of claim 1 wherein the integrated circuit die further comprises:

at least one driver circuit having an output node electrically coupled to at least one of the plurality of contacts.

3. The apparatus of claim 1 wherein the integrated circuit package substrate further comprises:

a third electrically conductive layer located between the first conductive layer and the second conductive layer, the third electrically conductive layer including at least a third layer contact located below the first contact of the first electrically conductive layer, wherein the third layer contact is electrically coupled to the first contact.

4. The apparatus of claim 1 wherein the integrated circuit package substrate further comprises:

a third electrically conductive layer located below the second conductive layer, the third electrically conductive layer including a third layer void region located below the first void region of the second conductive layer.

5. The apparatus of claim 1 wherein the first void region has an area sized to approximate an area of the first contact.

6. The apparatus of claim 1 wherein the first void region has a shape approximating a shape of the first contact.

7. The apparatus of claim 1 wherein the first void region is located directly below the first contact.

8. The apparatus of claim 1 wherein the integrated circuit die further comprises a serializer/deserializer circuit.

9. The apparatus of claim 1 wherein the second electrically conductive layer is a metal interconnect layer and wherein the first void region corresponds to at least one portion of the metal interconnect layer where metal is absent.

10. The apparatus of claim 1 wherein the surface mount electronic component is one of an active component and a passive component.

11. The apparatus of claim 1 wherein the surface mount electronic component is one of a resistor, an inductor, and a capacitor.

12. The apparatus of claim 1 wherein the first void region is aligned with the first contact.

13. The apparatus of claim 2 wherein the at least one driver circuit is one of a current mode logic (CML) driver circuit, a low-voltage differential signal (LVDS) driver circuit, and a positive-referenced emitter-coupled logic (PECL) driver circuit.

14. The apparatus of claim 13 wherein the at least one driver circuit is an AC-coupled CML driver circuit.

15. An integrated circuit package comprising:

a first electrically conductive layer having a plurality of contacts including at least first, second, third, and fourth contacts, the first and second contacts configured to receive a surface mount electronic component and the second contact electrically coupled to the third contact;

a second electrically conductive layer located below the first electrically conductive layer and including at least first and second void regions located below the first and second contacts, respectively;

a third electrically conductive layer located between the first conductive layer and the second conductive layer, the third electrically conductive layer including at least first and second third layer contacts located below the first and second contacts of the first conductive layer, respectively, wherein the first and second third layer contacts are electrically coupled to the first and second contacts;

a fourth electrically conductive layer located below the second conductive layer, the fourth electrically conductive layer including at least first and second fourth layer void regions located below the first and second void regions of the second conductive layer, respectively;

an integrated circuit die coupled to contacts of the first electrically conductive layer, the integrated circuit die including a driver circuit having an output node electrically coupled to the first contact and a power supply node electrically coupled to the fourth contact;

an inductor coupled between the first contact and the second contact of the first conductive layer;

a resistor coupled between the third contact and the fourth contact; and an electronic component surface mounted to the first and second contacts of the first conductive layer.

16. The apparatus of claim 15 wherein the surface mount electronic component is one of an active component and a passive component.

17. The apparatus of claim 15 wherein the surface mount electronic component is one of a resistor, an inductor, and a capacitor.

18. The apparatus of claim 15 wherein the first-void region is aligned with the first contact.

19. The apparatus of claim 15 wherein the first void region is located directly below the first contact.

* * * * *

UNITED STATES PATENT AND TRADEMARK OFFICE
CERTIFICATE OF CORRECTION

| | | |
|---|---|---|
| PATENT NO. | : 7,304,863 B1 | Page 1 of 1 |
| APPLICATION NO. | : 10/457630 | |
| DATED | : December 4, 2007 | |
| INVENTOR(S) | : Weijia Wu | |

It is certified that error appears in the above-identified patent and that said Letters Patent is hereby corrected as shown below:

Col. 9, line 6: "the first electrically conductive;" should read -- the first electrically conductive layer; --

Signed and Sealed this

Seventeenth Day of March, 2009

JOHN DOLL
*Acting Director of the United States Patent and Trademark Office*